United States Patent
Yamazaki et al.

(10) Patent No.: US 12,459,747 B2
(45) Date of Patent: Nov. 4, 2025

(54) BULK FEEDER

(71) Applicant: FUJI CORPORATION, Chiryu (JP)

(72) Inventors: Yusuke Yamazaki, Chiryu (JP); Hideyuki Hasegawa, Nagoya (JP); Yuji Kawasaki, Nagoya (JP)

(73) Assignee: FUJI CORPORATION, Chiryu (JP)

( * ) Notice: Subject to any disclaimer, the term of this patent is extended or adjusted under 35 U.S.C. 154(b) by 186 days.

(21) Appl. No.: 18/261,774

(22) PCT Filed: Jan. 29, 2021

(86) PCT No.: PCT/JP2021/003421
§ 371 (c)(1),
(2) Date: Jul. 17, 2023

(87) PCT Pub. No.: WO2022/162916
PCT Pub. Date: Aug. 4, 2022

(65) Prior Publication Data
US 2024/0076133 A1 Mar. 7, 2024

(51) Int. Cl.
*H05K 13/02* (2006.01)
*B65G 27/04* (2006.01)
(Continued)

(52) U.S. Cl.
CPC ............. *B65G 27/16* (2013.01); *B65G 27/04* (2013.01); *B65G 47/16* (2013.01); *B65G 2201/04* (2013.01)

(58) Field of Classification Search
CPC ........ B65G 27/04; B65G 27/16; B65G 47/16; B65G 47/18; B65G 47/20; B65G 65/44; H05K 13/02
(Continued)

(56) References Cited

U.S. PATENT DOCUMENTS

| 5,934,505 A * | 8/1999 | Shimada ............... H05K 13/028 198/396 |
| 6,062,423 A * | 5/2000 | Saito .................... H05K 13/028 221/200 |

(Continued)

FOREIGN PATENT DOCUMENTS

| JP | 6-1423 A | 1/1994 |
| JP | 11-238998 A | 8/1999 |

(Continued)

*Primary Examiner* — Douglas A Hess
(74) *Attorney, Agent, or Firm* — Oblon, McClelland, Maier & Neustadt, L.L.P.

(57) ABSTRACT

A bulk feeder includes a feeder main body, a receiving member provided on the feeder main body and formed with a receiving region configured to receive a component discharged from a component case accommodating multiple components, a track member provided to be vibratable with respect to the feeder main body and formed with a conveyance path through which the multiple components are conveyed and a supply region that communicates with the conveyance path and opens upward to collect the multiple components, an excitation device configured to apply vibration to the track member so that the multiple components are conveyed along the conveyance path, and a connection member having flexibility and configured to connect between the receiving region and the conveyance path so that the multiple components flows through.

8 Claims, 3 Drawing Sheets

(51) Int. Cl.
*B65G 27/16* (2006.01)
*B65G 47/16* (2006.01)
*B65G 47/18* (2006.01)
*B65G 47/20* (2006.01)
*B65G 65/44* (2006.01)

(58) Field of Classification Search
USPC .................. 198/396, 766, 768, 789; 221/236
See application file for complete search history.

(56) References Cited

U.S. PATENT DOCUMENTS

| | | | | |
|---|---|---|---|---|
| 6,135,264 | A * | 10/2000 | Saito | H05K 13/028 |
| | | | | 198/383 |
| 6,161,676 | A * | 12/2000 | Takahashi | H05K 13/028 |
| | | | | 198/397.03 |
| 6,305,524 | B1 * | 10/2001 | Dub | B65G 47/1407 |
| | | | | 198/771 |
| 6,443,326 | B1 * | 9/2002 | Saito | H05K 13/028 |
| | | | | 221/163 |
| 6,685,052 | B1 * | 2/2004 | Nemoto | B65G 47/1428 |
| | | | | 221/163 |
| 7,284,934 | B2 * | 10/2007 | Hoogers | H05K 13/027 |
| | | | | 406/137 |
| 7,837,061 | B2 * | 11/2010 | Dummer | G07F 11/44 |
| | | | | 221/278 |
| 10,087,016 | B2 * | 10/2018 | Nakajima | H05K 13/02 |
| 10,875,134 | B2 * | 12/2020 | Billiard | B23P 19/08 |
| 11,247,285 | B1 * | 2/2022 | Collins | B65G 47/1457 |

FOREIGN PATENT DOCUMENTS

| | | |
|---|---|---|
| JP | 2011-66222 A | 3/2011 |
| JP | 2011-114084 A | 6/2011 |
| JP | 2013-168584 A | 8/2013 |

* cited by examiner

BULK FEEDER

TECHNICAL FIELD

The present disclosure relates to a bulk feeder.

BACKGROUND ART

A bulk feeder is provided in a component mounter for mounting a component on a substrate, and is used for supplying the component in a bulk state. The bulk feeder conveys multiple components discharged from a component case, and supplies the components in a supply region opened upward so that a suction nozzle can collect the components. Patent Literature 1 discloses a configuration for applying vibration to a conveyance path to convey multiple components.

PATENT LITERATURE

Patent Literature 1: JP-A-2011-114084

BRIEF SUMMARY

Technical Problem

In such a bulk feeder, a member forming a conveyance path is a vibration member configured to be able to vibrate with respect to a fixing member such as a component case. The vibration member and the fixing member are connected to each other so as to be able to flow through the component in a bulk state. A connection member connecting the vibration member and the fixing member is required to prevent outflow of flowing components and not to affect vibration characteristics of the vibration member.

An object of the present specification is to provide a bulk feeder capable of preventing outflow of a component in a bulk state in a conveying process and appropriately performing a conveying operation of the component using vibration.

Solution to Problem

According to the present specification, there is provided a bulk feeder including: a feeder main body; a receiving member provided on the feeder main body and formed with a receiving region configured to receive a component discharged from a component case accommodating multiple components; a track member provided to be vibratable with respect to the feeder main body and formed with a conveyance path through which the multiple components are conveyed and a supply region that communicates with the conveyance path and opens upward to collect the multiple components; an excitation device configured to apply vibration to the track member so that the multiple components are conveyed along the conveyance path; and a connection member having flexibility and configured to connect between the receiving region and the conveyance path so that the multiple components flows through.

Advantageous Effects

With such a configuration, since a connection member having flexibility suppresses the transmission of vibration between a track member and a receiving member, it is possible to prevent the receiving member on a fixing side from affecting vibration characteristics of the track member. Accordingly, in the bulk feeder, a component in a bulk state is introduced into the track member via the connection member, so that a conveying operation of the component using vibration can be appropriately performed. In addition, since the connection member has flexibility, a gap for allowing vibration is not required between the track member and the connection member, so that it is possible to prevent outflow of the component.

DESCRIPTION OF EMBODIMENTS

1. Configuration of Bulk Feeder 30

Bulk feeder 30 is provided in a component mounter (not illustrated) and functions as a part of a component supply device. Bulk feeder 30 supplies component 92 accommodated in a bulk state that is not aligned like a carrier tape. Therefore, since bulk feeder 30 does not use a carrier tape unlike the tape feeder, it has a merit in that loading of the carrier tape, collection of the used tape, or the like can be omitted.

Bulk feeder 30 is, for example, of a type that supplies component 92 in an irregular posture to a planar supply region As. However, when components 92 are so close to each other or deposited (in a state overlapping in the up-down direction) that components 92 are in contact with each other in supply region As, or when component 92 are in a horizontal posture and a width direction of components 92 is in an up-down direction, these components 92 cannot be as the collection target. Accordingly, in order to increase an amount of components 92 which can be collected, there is a type of bulk feeder 30 that supplies components 92 in an aligned state in supply region As. In the present embodiment, bulk feeder 30 of the type in which components 92 are aligned will be exemplified.

1-1. Feeder Main Body 31

Figure 1:
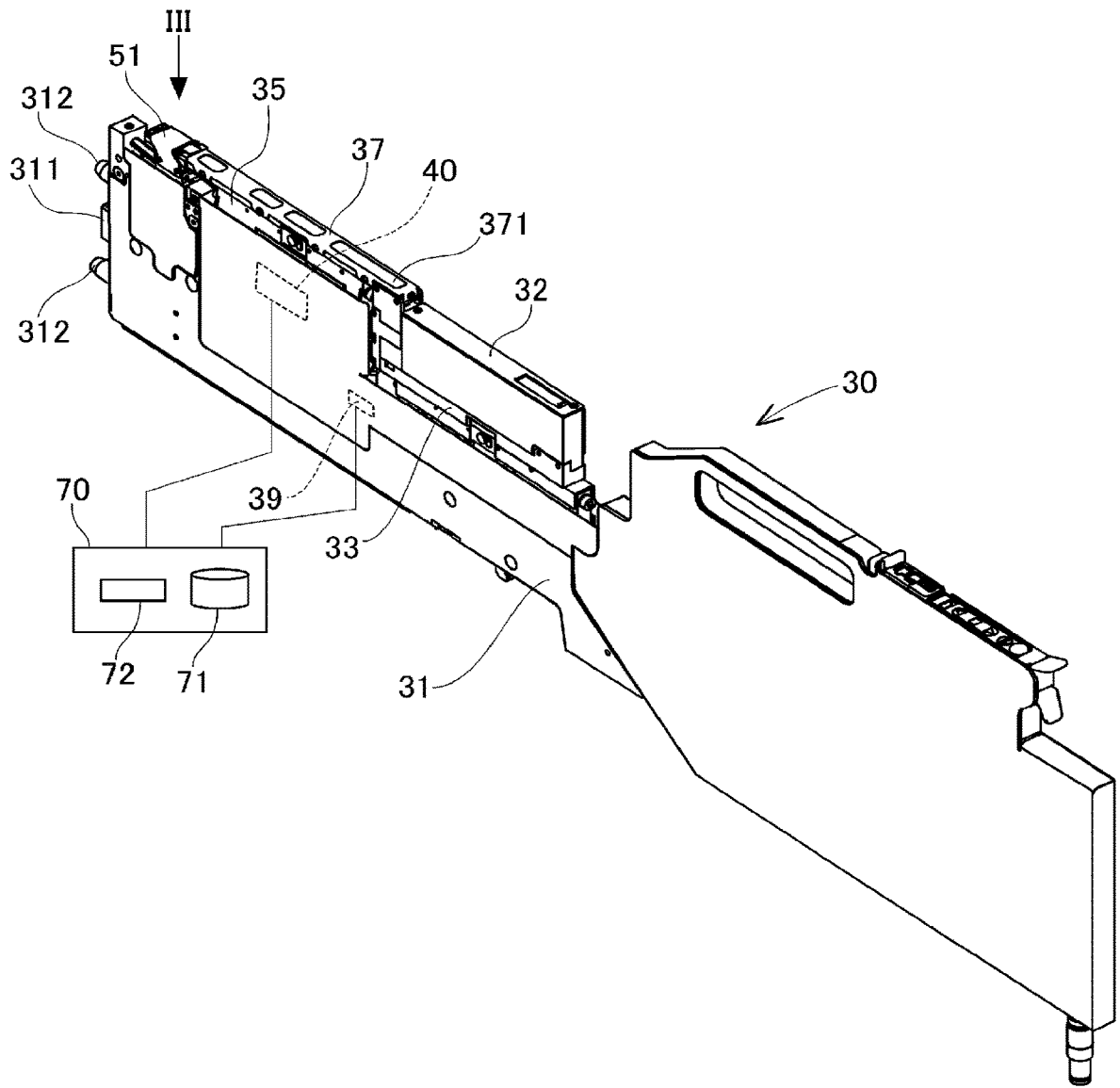
FIG. 1 is a perspective view illustrating an appearance of a bulk feeder.
Figure 2:
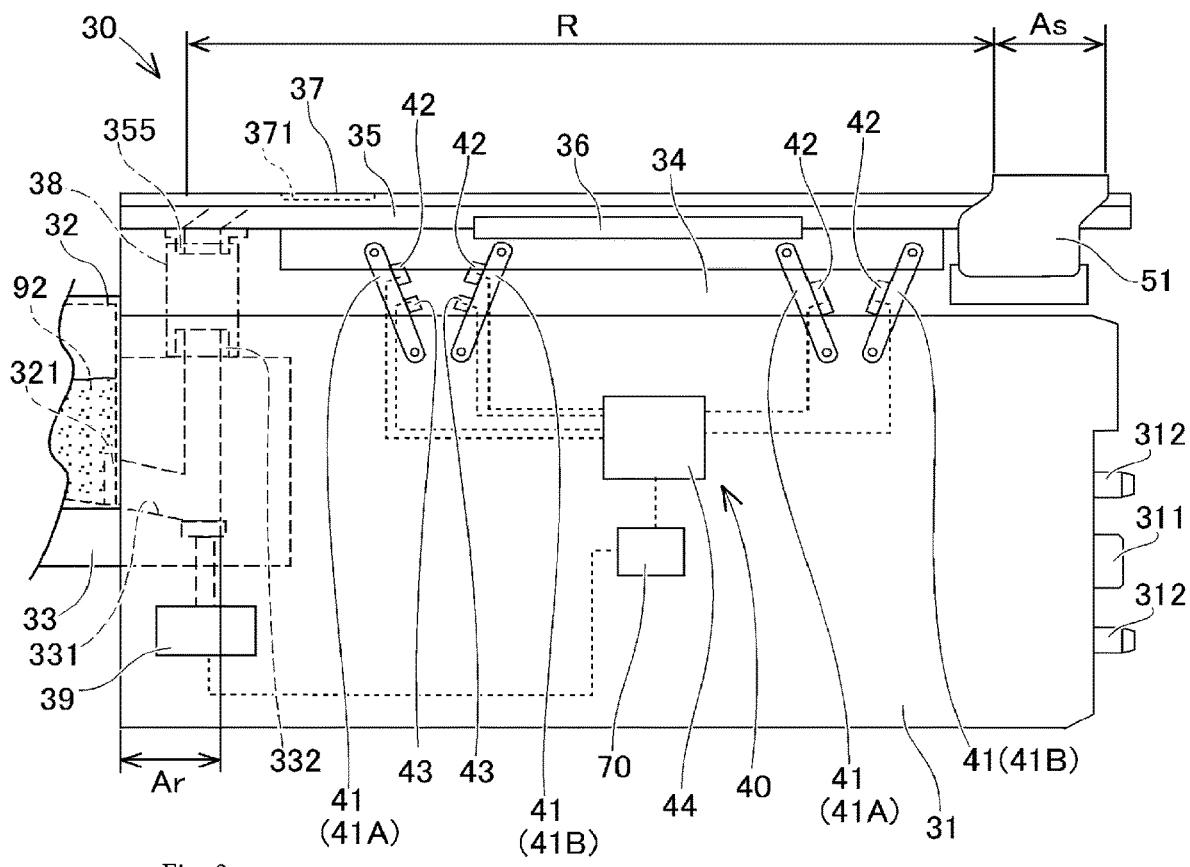
FIG. 2 is a side view schematically illustrating a main part of the bulk feeder.

As illustrated in FIG. 1, bulk feeder 30 includes feeder main body 31 formed in a flat box shape. Connector 311 and two pins 312 are provided at a front portion of feeder main body 31. When feeder main body 31 is set in a slot of the component supply device, power is supplied via the connector 311 and feeder main body 31 becomes communicable with a control device of a component mounter. Two pins 312 are inserted into guide holes provided in the slots, and are used for positioning when feeder main body 31 is set in the slots.

1-2. Component Case 32 and Receiving Member 33

Component case 32 for accommodating multiple components 92 in a bulk state is detachably attached to feeder main body 31 via receiving member 33. Component case 32 is an external device of bulk feeder 30. One suitable for the mounting process is selected from various types of component cases 32 and attached to feeder main body 31. Discharge port 321 through which component 92 is discharged to the outside is formed in a front portion of component case 32.

Receiving member 33 is provided to be vibratable with respect to feeder main body 31, and supports attached component case 32. Receiving member 33 is formed with receiving region Ar for receiving component 92 discharged from component case 32. In the present embodiment, receiving member 33 has inclined portion 331 inclined toward the front side with respect to a horizontal plane in at least a portion of receiving region Ar. Inclined portion 331 is located below discharge port 321 of component case 32 and has a planar shape. Receiving member 33 is formed with a flow path of component 92 extending above receiving region Ar, and feed-out section 332 through which the flow path opens upward is formed.

1-3. Bracket 34, Track Member 35, and Lock Unit 36

Bulk feeder 30 includes bracket 34 and track member 35. Bracket 34 is provided to be vibratable with respect to feeder main body 31. Bracket 34 is formed in a block shape extending in a front-rear direction of feeder main body 31, and track member 35 is attached to an upper surface of bracket 34. Bracket 34 is supported by support member 41 of excitation device 40 described later. Track member 35 is formed with conveyance path R through which multiple components 92 are conveyed, and supply region As that communicates with conveyance path R and opens upward so as to be able to collect multiple components 92.

Bulk feeder 30 includes lock unit 36. Lock unit 36 locks track member 35 in a state in which track member 35 is attached to bracket 34. When track member 35 is locked by lock unit 36, track member 35 vibrates integrally with bracket 34 with respect to feeder main body 31. Track member 35 is made detachable from bracket 34 by unlocking of lock unit 36.

1-4. Detailed Configuration of Track Member 35, Cover 37, and Connection Member 38

Figure 3:
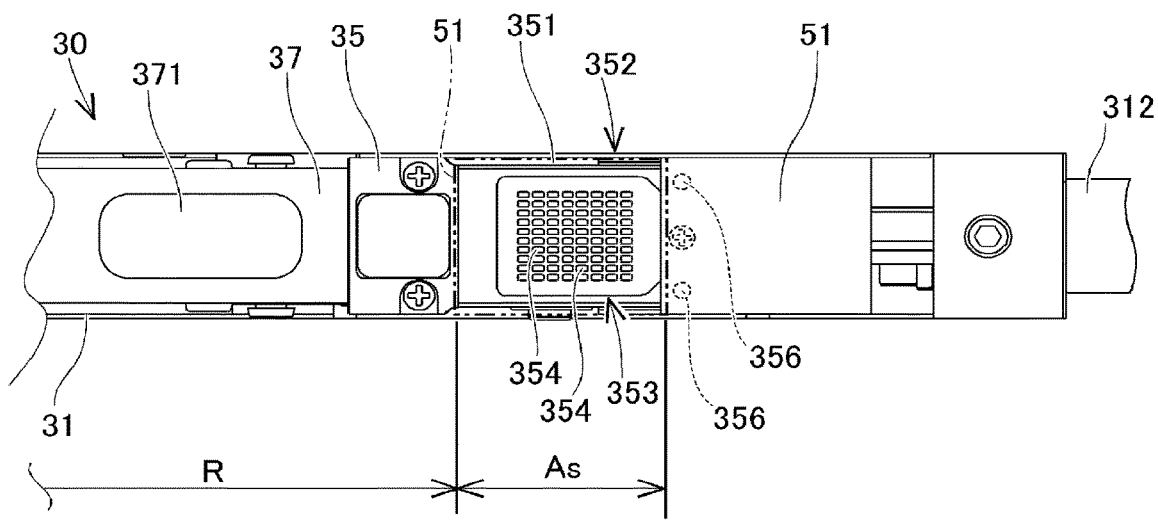
FIG. 3 is a plan view as viewed from a III direction in FIG. 1.

Track member 35 is formed so as to extend in the front-rear direction (left-right direction in FIG. 3) of feeder main body 31. Pair of side walls 351 protruding upward is formed on both edges of track member 35 in the width direction (the up-down direction in FIG. 3). Pair of side walls 351 surrounds a periphery of conveyance path R together with distal end portion 352 of track member 35, so as to prevent leakage of component 92 conveyed through conveyance path R. Circular reference mark 356 indicating a reference position of supply region As is affixed to an upper surface of distal end portion 352 in a pair in the left-right direction.

In the present embodiment, alignment member 353 is exchangeably attached to track member 35. Alignment member 353 has multiple cavities 354 that individually accommodate multiple components 92. Specifically, multiple cavities 354 are arranged in a matrix in supply region As. For example, alignment member 353 has a total of 80 cavities 354 that are regularly arranged in 8 cavities in the conveyance direction by 10 cavities in the width direction of conveyance path R. Each of multiple cavities 354 opens upward to accommodate component 92 in a posture in which a thickness direction of component 92 is in the up-down direction.

The opening of cavity 354 is set to a dimension slightly larger than an outer shape of component 92 in an upward view. The depth of cavity 354 is set according to the type (shape, mass, or the like) of component 92. One selected from various types of track members 35 based on the type of component 92, the required number of cavities 354, and the functionality is attached.

Here, the "supply region As" of track member 35 is a region for supplying component 92 in a bulk state, which is a region where component 92 can be collected by a holding member (for example, a suction nozzle for picking up the component by the negative pressure air) supported by a mounting head of the component mounter. In addition, "conveyance path R" of track member 35 is a path of component 92 through which component 92 flowed from receiving region Ar to track member 35 is conveyed to supply region As.

Bulk feeder 30 includes cover 37. Cover 37 is fixed to track member 35 and covers an upper portion of conveyance path R. Cover 37 has multiple exhaust ports 371 formed on an upper surface thereof. A mesh having a joint smaller than an outer dimension of component 92 is stretched in exhaust port 371. With such a configuration, cover 37 is configured to be able to discharge air from exhaust port 371 to the outside while preventing component 92 from protruding from conveyance path R.

Track member 35 is formed with a flow path of component 92 extending downward at a rear portion thereof, and has introduction portion 355 through which the flow path opens downward. Introduction portion 355 faces feed-out section 332 of receiving member 33 disposed below track member 35 in the up-down direction. Bulk feeder 30 includes connection member 38 that connects between receiving region Ar and conveyance path R so that multiple components 92 can flow through. Specifically, connection member 38 has a tubular shape in which multiple components 92 can flow through, and connects feed-out section 332 of receiving member 33 and introduction portion 355 of track member 35.

Connection member 38 has flexibility. In addition, connection member 38 absorbs the vibration by being deformed in accordance with the vibration of receiving member 33 and the vibration of track member 35 with respect to feeder main body 31. Connection member 38 alleviates or blocks vibration transmitted between receiving member 33 and track member 35 that vibrate independently of each other. In the present embodiment, connection member 38 is a tight coil spring, and thus has flexibility as a whole.

In the tight coil spring, in an initial state in which an external force in a pulling direction is not applied, annular windings adjacent to each other come into close contact with each other. As a result, the tight coil spring can be applied as a member for forming an air flow path in the initial state in which it is not deformed. A lower end of connection member 38 is fitted into an outer periphery of a cylindrical portion formed with feed-out section 332. Similarly, an upper end of connection member 38 is fitted into the outer periphery of the cylindrical portion formed with introduction portion 355. As a result, inner peripheral surfaces of both end portions of connection member 38 come into close contact with an outer peripheral surface of each cylindrical portion.

According to such a configuration, air and component 92 are prevented from flowing out from between the inner peripheral surface of connection member 38 and the outer peripheral surface of each cylindrical portion. It should be noted that the inner peripheral surfaces of both end portions of connection member 38 may have a slight gap (set to be smaller than the minimum dimension (that is, the thickness of component 92) of component 92) with the outer peripheral surface of each cylindrical portion. The same effect can be obtained from such a configuration.

1-5. Air Supply Device 39

Bulk feeder 30 includes air supply device 39. Air supply device 39 supplies positive pressure air from a lower side of receiving region Ar, so that multiple components 92 are caused to flow from receiving member 33 to track member 35 via connection member 38. In the present embodiment, air supply device 39 supplies or blocks the positive pressure air supplied from the outside from a lower side of receiving region Ar based on a command from feeder control device 70 described later. Details of the supply operation of component 92 including the operation of air supply device 39 will be described later.

1-6. Excitation Device 40

Bulk feeder 30 includes excitation device 40 provided in feeder main body 31. Excitation device 40 applies vibration to track member 35 so that multiple components 92 are conveyed along conveyance path R. Specifically, excitation device 40 includes multiple support members 41, multiple piezoelectric elements 42, vibration sensor 43, and power supply device 44. Multiple support members 41 directly or indirectly connect feeder main body 31 and bracket 34 to support bracket 34.

In the present embodiment, multiple support members 41 include forward movement support member 41A used for front-side conveyance of component 92 and rearward movement support member 41B used for rear-side conveyance. The inclination directions of forward movement support member 41A and rearward movement support member 41B with respect to the vertical direction are different from each other. Multiple piezoelectric elements 42 are vibrators that vibrate at a frequency corresponding to power supplied from power supply device 44. Multiple piezoelectric elements 42 are attached to multiple support members 41, respectively.

When at least some of multiple piezoelectric elements 42 vibrate, vibration is applied to track member 35 via bracket 34. In addition, the amplitude of track member 35 changes in accordance with the voltage applied to piezoelectric element 42. Vibration sensor 43 detects the frequency or amplitude of the actual vibration of track member 35 when piezoelectric element 42 is supplied with power and vibrated. In the present embodiment, vibration sensor 43 is provided in multiple support members 41 that support bracket 34 that vibrates integrally with track member 35.

Here, when excitation device 40 applies vibration to track member 35, track member 35 performs an elliptical motion in the side view. As a result, an external force of a front side and an upper side, or an external force of a rear side and an upper side is applied to multiple components 92 in conveyance path R according to the rotational direction of the elliptical motion of track member 35. As a result, multiple components 92 are conveyed to the front side or the rear side of track member 35.

Power supply device 44 changes the frequency and the applied voltage of the power supplied to piezoelectric element 42 based on a command of feeder control device 70 described later. As a result, the frequency and the amplitude of the vibration applied to track member 35 are adjusted, so that the rotational direction of the elliptical motion of track member 35 is determined. When the frequency or amplitude of the vibration of track member 35 and the rotational direction of the elliptical motion caused by the vibration change, a conveyance speed of component 92 to be conveyed, a degree of dispersion of component 92, a conveyance direction, and the like change.

Therefore, in order to improve conveyance efficiency, excitation device 40 sets in advance power supply (frequency, applied voltage) corresponding to vibration characteristics (including the natural frequency) having individual differences. For example, bulk feeder 30 executes the calibration processing in a state in which track member 35 used for a supply operation to be executed is attached, that is, in a state in which track member 35 is locked by lock unit 36 with respect to bracket 34.

In this calibration processing, first, at least one of the frequency and the amplitude of the actual vibration of track member 35 is measured based on the value detected by vibration sensor 43. Then, in the calibration processing, the power to piezoelectric element 42 by power supply device 44 is adjusted based on the measurement result regarding the vibration. The calibration processing is repeated to acquire power supplied to piezoelectric element 42 when bracket 34 and track member 35 integrally vibrate at the natural frequency.

1-7. Shutter 51

Bulk feeder 30 has shutter 51 provided above track member 35 and is capable of closing the opening of supply region As. By opening or closing shutter 51, bulk feeder 30 can prevent component 92 from protruding and foreign matters from entering supply region As. In the present embodiment, shutter 51 is switched between an open state, a closed state, and an intermediate state by an opening/closing operation. The closed state of shutter 51 is a state in which shutter 51 comes into contact with track member 35 and the opening of supply region As is completely closed. At this time, as indicated by dashed lines in FIG. 3, shutter 51 is located on the rear side of feeder main body 31 with respect to pair of reference marks 356 of track member 35, so that pair of reference marks 356 can be visually recognized and imaged in the upward view.

In addition, the open state of shutter 51 is a state in which the opening of supply region As is not closed and a principal range (range where multiple cavities 354 are provided in the present embodiment) of supply region As is exposed. At this time, suction nozzle 134 can execute the collection operation of component 92 on any of the cavities 354. The intermediate state of shutter 51 is a state between the closed state and the open state in which shutter 51 is separated from track member 35 by at least the amplitude of track member 35 vibrated by the excitation of excitation device 40, and restricts the protruding of component 92 from the opening of supply region As. Shutter 51 is opened or closed by a driving device (not illustrated), and is brought into the closed state, the open state, and the intermediate state according to a driving state of the driving device.

1-8. Feeder Control Device 70

Bulk feeder 30 includes feeder control device 70. Feeder control device 70 mainly includes a CPU, various memories, or a control circuit. Feeder control device 70 is powered via connector 311 in a state in which bulk feeder 30 is set in slot, and is placed in a state capable of communicating with the control device of the component mounter.

As illustrated in FIG. 1, feeder control device 70 includes storage section 71. Storage section 71 includes a flash memory or the like. Storage section 71 stores various data such as a program and a conveyance parameter used for controlling the component supplying process. The above-mentioned "conveyance parameter" is a parameter for controlling the operation of excitation device 40 so that the vibration applied to track member 35 is appropriate when component 92 is conveyed in the component supplying process, and is set in advance in association with each type of component 92, for example.

Feeder control device 70 includes conveyance control section 72. The conveyance control section 72 controls the operation of excitation device 40 to execute the conveying operation of component 92. Specifically, the conveyance control section 72 sends a command to power supply device 44 of excitation device 40 when executing the conveying operation. As a result, when power supply device 44 supplies a predetermined power to piezoelectric element 42, vibration is applied to track member 35 via bracket 34. Then, component 92 on conveyance path R is conveyed by receiving an external force so as to move in the conveyance direction.

2. Supply Operation of Component 92

Figure 4:
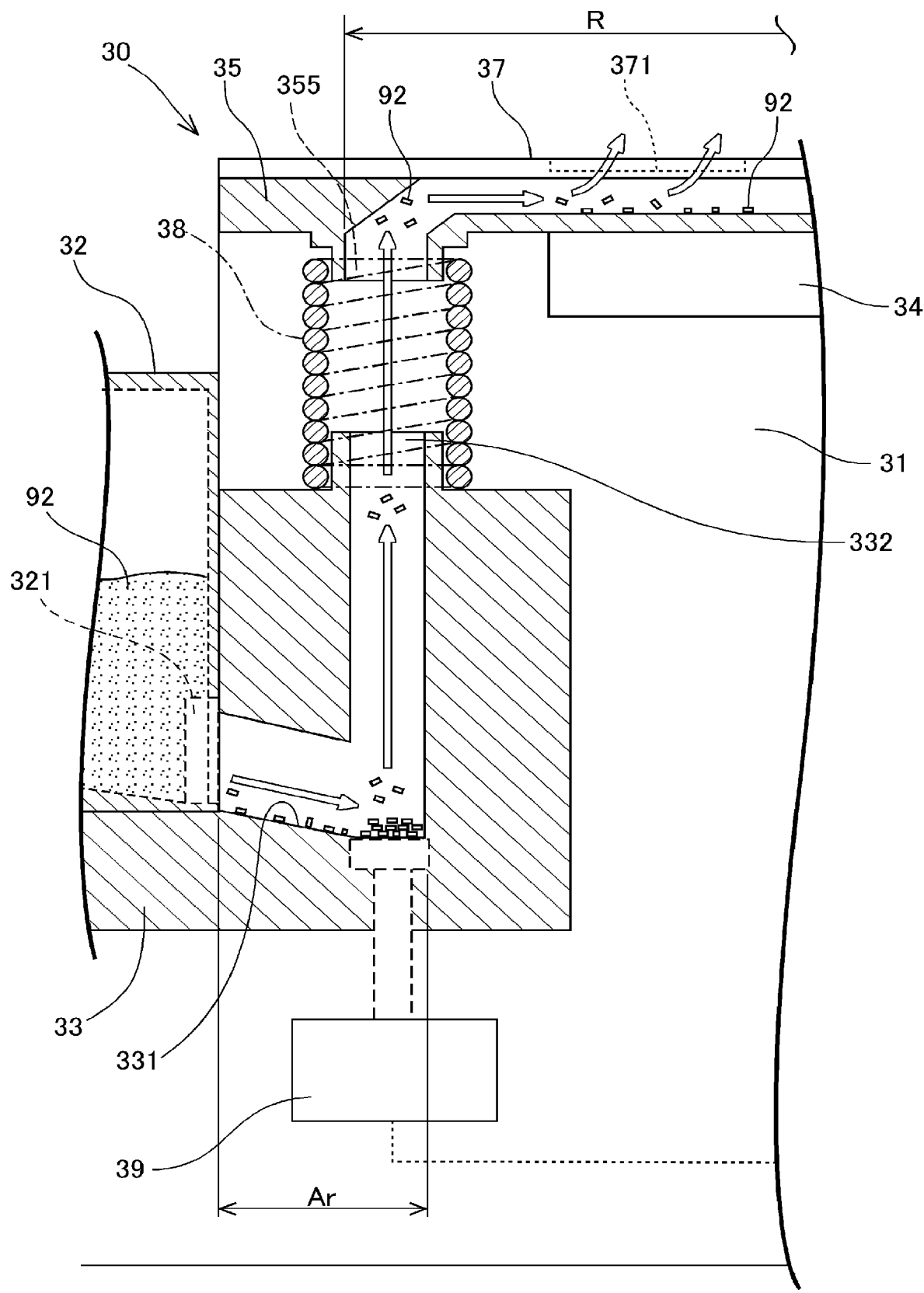
FIG. 4 is an enlarged view illustrating a flow operation of a component from receiving region Ar to conveyance path R.

The supply operation of component 92 by bulk feeder 30 having the above-described configuration will now be described with reference to FIG. 4. First, feeder control device 70 discharges component 92 from component case 32 based on, for example, an external supply command. Specifically, feeder control device 70 applies vibration to receiving member 33 to which component case 32 is attached. This vibration is applied by an excitation device (not illustrated) for discharging components different from excitation device 40 for exciting bracket 34 and track member 35.

When component case 32 vibrates, component 92 is discharged from opened discharge port 321. As indicated by a dashed arrow in FIG. 4, discharged component 92 falls into inclined portion 331 of receiving member 33 located below discharge port 321, and slides on the front side along the inclined surface of inclined portion 331. As a result, component 92 stays at the lower end portion of the front side of inclined portion 331 in receiving region Ar. In this state, feeder control device 70 instructs air supply device 39 to supply the positive pressure air.

The positive pressure air supplied by air supply device 39 blows up multiple components 92 staying in receiving region Ar, and flows through the flow path formed in receiving member 33 together with components 92. A bold arrow in FIG. 4 represents the flow of the positive pressure air. As a result, the positive pressure air and multiple components 92 flow through feed-out section 332 of receiving member 33, connection member 38, and track member 35 in this order, and reach conveyance path R of track member 35. Here, the positive pressure air is exhausted to the outside from exhaust port 371 of cover 37. In addition, multiple components 92 fall into conveyance path R of track member 35 by their own weight.

It should be noted that, as described above, during the operation of blowing up component 92 by air supply device 39 and flowing component 92 from receiving region Ar to conveyance path R, excitation device 40 for conveying the component and the excitation device (not illustrated) for discharging the component are maintained in the stopped state. That is, receiving member 33 and track member 35 are in a state in which the positional relationship therebetween is fixed. As a result, connection member 38 connecting receiving member 33 and track member 35 maintains the shape in the initial state.

As a result, even when the tight coil spring is applied to connection member 38 as in the present embodiment, the adjacent windings remain in close contact. Accordingly, it is possible to prevent the positive pressure air and component 92 from flowing out from between the adjacent windings. Thereafter, when excitation device 40 for conveying the component applies vibration to track member 35, multiple components 92 are conveyed to supply region As side. In addition, vibration for moving component 92 forward or rearward is applied to track member 35 in accordance with the supply amount of component 92 in supply region As, or the like.

When track member 35 is excited as described above, connection member 38 bends in accordance with the vibration of track member 35 in a state in which the lower end is supported by receiving member 33, and deforms as a whole. As a result, connection member 38 absorbs the vibration of track member 35 and prevents the vibration from being transmitted to receiving member 33. As a result, it is possible to prevent connection member 38 and receiving member 33 from affecting the vibration characteristics of track member 35. Accordingly, bulk feeder 30 can appropriately perform the conveying operation of component 92 using the vibration.

In addition, when connection member 38 serving as the tight coil spring is deformed in accordance with the vibration of track member 35, the adjacent windings may be separated from each other to form a gap. However, in the conveying operation in which excitation device 40 applies vibration to track member 35, since the blowing up of component 92 (the flow operation from receiving region Ar to conveyance path R) using air supply device 39 is not performed, there is no problem in the supply operation of component 92 even when the gap occurs.

3. Effect According to Configuration of Embodiment

With such a configuration, since connection member 38 having flexibility suppresses the transmission of vibration between track member 35 and receiving member 33, it is possible to prevent receiving member 33 on the fixing side from affecting the vibration characteristics of track member 35. Accordingly, in bulk feeder 30, component 92 in the bulk state is introduced into track member 35 via connection member 38, so that the conveying operation of component 92 using the vibration can be appropriately performed.

In addition, since connection member 38 has flexibility, a gap for allowing the vibration is not required between track member 35 and connection member 38, so that component 92 can be prevented from flowing out. In the type requiring the gap described above, the gap should be set to be larger than the amplitude of the vibration of track member 35 and smaller than the minimum dimension of component 92, and the accuracy required for assembly is also high. On the other hand, according to the configuration of the present embodiment, since connection member 38 can be made low in cost and the assembling property can be improved, a manufacturing cost of bulk feeder 30 can be reduced.

4. Modification of Embodiment 4-1. Connection Member 38

In the embodiment, connection member 38 is the tight coil spring formed of metal as a material. Meanwhile, connection member 38 may be formed of a resin or rubber material as long as it has flexibility at least in a part thereof. In addition, connection member 38 may be a thin-walled tube made of resin or rubber, for example, in addition to being the tight coil spring. Further, connection member 38 may be configured to have a bellows portion between both end portions.

Even with the above-described configuration, the same effects as in the embodiment can be obtained. However, from the viewpoint of reducing the influence of track member 35 on the vibration characteristics in the conveying operation, the resistance to aging, and the like, it is preferable to make connection member 38 made of metal as exemplified in the embodiment. In addition, from the viewpoint of improving the flow property of component 92 using the positive pressure air in the flow operation, it is preferable to use a cylindrical inner surface, and it is preferable to use a mode in which connection member 38 is the tight coil spring or a thin-walled tube.

4-2. Receiving Member 33

In the embodiment, receiving member 33 has inclined portion 331 formed on the rear side of receiving region Ar. Meanwhile, inclined portion 331 may be formed over the entire region of receiving region Ar. In addition, inclined portion 331 has a function of promoting the front movement of multiple components 92 discharged from component case 32, thereby preventing multiple components 92 from staying in the vicinity of discharge port 321.

Accordingly, various forms of inclined portion 331 may be adopted in accordance with the position and shape of discharge port 321 of component case 32 attached to receiving member 33. For example, inclined portion 331 may be formed in a curved shape in addition to a planar shape in a side view of feeder main body 31. In addition, the inclined portion 331 appropriately sets the length in the front-rear direction and the inclination angle with respect to the horizontal plane. Specifically, the length and angle of inclined portion 331 are set based on the positional relationship between discharge port 321 and the air discharging port of air supply device 39, the dimensions and shapes of component 92, and the operating characteristics of the excitation device for discharging the component.

As a result, multiple components 92 are suitably moved from the lower portion of discharge port 321 to the air discharging port. Accordingly, it is possible to suitably perform the discharging operation of multiple components 92, the movement to the air discharging port, and the flow operation by blowing up using the positive pressure air. It should be noted that the aspects illustrated in the embodiments are preferred from the viewpoint of the function and the manufacturing cost required for receiving member 33.

4-3. Track Member 35

In the embodiment, track member 35 of bulk feeder 30 includes alignment member 353 having multiple cavities 354 formed therein. Meanwhile, a configuration may be adopted in which alignment member 353 is omitted. That is, in supply region As of track member 35, a recessed portion in which component 92 is dispersed at a position lower than the upper surface of conveyance path R, or a planar portion uniform with the upper surface of conveyance path R may be formed, so that component 92 is supplied in the bulk state. It should be noted that, from the viewpoint of improving the efficiency of the component supplying process or reducing the load of the image processing in the recognition processing of the supply state in supply region As, the configuration described in the embodiment is preferable.

REFERENCE SIGNS LIST

30: bulk feeder, 31: feeder main body, 32: component case, 321: discharge port, 33: receiving member, 331: inclined portion, 332: feed-out section, 34: bracket, 35: track member, 355: introduction portion, 37: cover, 371: exhaust port, 38: connection member, 39: air supply device, 40: excitation device, 70: feeder control device, 92: component, Ar: receiving region, As: supply region, R: conveyance path

The invention claimed is:

1. A bulk feeder comprising:
a feeder main body;
a receiving member provided on the feeder main body and formed with a receiving region configured to receive a component discharged from a component case accommodating multiple components;
a track member provided to be vibratable with respect to the feeder main body and formed with a conveyance path through which the multiple components are conveyed and a supply region that communicates with the conveyance path and opens upward to collect the multiple components;
an excitation device configured to apply vibration to the track member so that the multiple components are conveyed along the conveyance path;
a connection member having flexibility and configured to connect between the receiving region and the conveyance path, the connecting member having a tubular shape in which the multiple components flows through;
an air supply device configured to supply positive pressure air to flow the multiple components from the receiving member to the track member via the connection member; and
a controller including a processor configured to control the excitation device and the air supply device such that when the excitation device is operating, the air supply device is stopped, and when the air supply device is operating, the excitation device is stopped.

2. The bulk feeder according to claim 1, wherein the connection member absorbs vibration by being deformed in accordance with vibration of the track member when the track member is excited by the excitation device, and alleviates or blocks vibration transmitted to the receiving member.

3. The bulk feeder according to claim 1, wherein the connection member is a coil spring.

4. The bulk feeder according to claim 3, wherein the connection member is formed of a metal material.

5. The bulk feeder according to claim 1, wherein the connection member is formed of resin or rubber as a material.

6. The bulk feeder according to claim 1, wherein the receiving member is disposed below the track member.

7. The bulk feeder according to claim 1, wherein the receiving member has an inclined portion inclined with respect to a horizontal plane at least a portion of the receiving region.

8. The bulk feeder according to claim 7, wherein the inclined portion is located below a discharge port of the component case and has a planar shape.

* * * * *